(12) United States Patent
Arsovski et al.

(10) Patent No.: US 7,705,626 B2
(45) Date of Patent: Apr. 27, 2010

(54) DESIGN STRUCTURE TO ELIMINATE STEP RESPONSE POWER SUPPLY PERTURBATION

(75) Inventors: Igor Arsovski, Williston, VT (US); Joseph A. Iadanza, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 264 days.

(21) Appl. No.: 11/847,362

(22) Filed: Aug. 30, 2007

(65) Prior Publication Data
US 2008/0030254 A1 Feb. 7, 2008

Related U.S. Application Data

(63) Continuation-in-part of application No. 11/461,788, filed on Aug. 2, 2006, now Pat. No. 7,511,528.

(51) Int. Cl.
H03K 17/16 (2006.01)
H03K 19/003 (2006.01)

(52) U.S. Cl. .......................... 326/27; 326/33; 716/4; 716/12

(58) Field of Classification Search ............. 326/26–27, 326/31, 33; 716/4, 12
See application file for complete search history.

(56) References Cited

U.S. PATENT DOCUMENTS

| | | | | |
|---|---|---|---|---|
| 6,523,150 | B1 * | 2/2003 | Buffet et al. | 716/4 |
| 6,584,596 | B2 * | 6/2003 | Buffet et al. | 716/1 |
| 6,631,502 | B2 * | 10/2003 | Buffet et al. | 716/4 |
| 7,088,131 | B1 * | 8/2006 | Stout et al. | 326/33 |
| 7,131,074 | B2 * | 10/2006 | Bednar et al. | 716/1 |
| 7,511,528 | B2 * | 3/2009 | Arsovski et al. | 326/27 |
| 2006/0158222 | A1 * | 7/2006 | Gattiker et al. | 326/82 |

* cited by examiner

*Primary Examiner*—James H. Cho
*Assistant Examiner*—Jason Crawford
(74) *Attorney, Agent, or Firm*—Scully, Scott, Murphy & Presser, P.C.; Michael J. LeStrange, Esq.

(57) ABSTRACT

A design structure for eliminating step response power supply perturbation during voltage island power-up/power-down on an integrated circuit is disclosed. An IC chip communicates with a primary power supply and includes at least one voltage island. A primary header on the voltage island of the chip communicates with the primary power supply via a primary header power path. A secondary header on the voltage island of the chip communicates with a secondary power supply via a secondary header power path. A control decoder communicating with the IC chip and the voltage island regulates the state of the primary and secondary headers.

18 Claims, 12 Drawing Sheets

| ISLAND CONTROL 0 (720) | ISLAND CONTROL 1 (722) | PRIMARY HEADER CONTROL (724) | SECONDARY HEADER CONTROL (726) | VOLTAGE ISLAND BOUNDARY (728) | STATE (730) |
|---|---|---|---|---|---|
| 0 | 0 | DISABLED | DISABLED | DISABLED | VOLTAGE ISLAND POWERED DOWN |
| 0 | 1 | DISABLED | ENABLED | DISABLED | VOLTAGE ISLAND PRECHARGING TO FUNCTIONAL RAIL VOLTAGE |
| 1 | 1 | ENABLED | DISABLED | DISABLED | VOLTAGE ISLAND SWITCHED ONTO GLOBAL RAIL |
| 1 | 0 | ENABLED | DISABLED | ENABLED | VOLTAGE ISLAND FUNCTIONAL MODE |

DESIGN STRUCTURE TO ELIMINATE STEP RESPONSE POWER SUPPLY PERTURBATION

CROSS REFERENCES TO RELATED APPLICATIONS

This application is a continuation-in-part of presently U.S. application Ser. No. 11/461,788, entitled "DEVICE AND METHOD TO ELIMINATE STEP RESPONSE POWER SUPPLY PERTURBATION", filed on Aug. 2, 2006, now U.S. Pat. No. 7,511,528 which is fully incorporated herein by reference.

FIELD OF THE INVENTION

The invention relates to a voltage island design structure on an integrated circuit, and more particularly, to a voltage island design structure for eliminating step response power supply perturbation during voltage island power-up/power down.

BACKGROUND OF THE INVENTION

Three principle sources of power supply perturbation exist within today's integrated circuits: resistive voltage (IR) drop; cyclic power supply ripple; and DI/DT induced supply bus ringing. IR drop is caused by the DC current demand of the Integrated Circuit (IC) and resistance of the power supply network within the IC and results in both reduced voltage at the operating circuits relative to the voltage supplied at IC level and voltage gradients across the IC. Cyclic power supply ripple is generated by clocked logic operating on the IC which creates periodic AC current variation and resultant voltage ripple. DI/DT induced supply bus ringing is caused by near-instantaneous current demand changes during IC power-up or when voltage island portions of the IC are enabled/disabled. These step response current changes excite the resistance/inductance/capacitance (RLC) network of the power supply bus generating a voltage ring that is damped over a transient time period which is much greater than the operational period (1/Operational Frequency) of the IC.

Current techniques for reducing DC/Ripple perturbation include quiet capacitance modeling and estimation, automatic power supply bus routing/generation and DC current modeling/load rebalancing. However, step response remains a serious problem in today's IC chips because voltage extremes produced during the step response dictate the minimum and maximum operating voltages encountered within an IC. In prior IC designs, the IC was powered up and down in total, and a wait time and reset performed after power bus stabilization to mitigate power-on transient response. Current IC designs increasingly provide voltage islands which are powered up and powered down multiple times while the remainder of the IC remains functional. A voltage island (VI) allows for one or more portions (islands) of an integrated circuit chip to be selectively powered by either a chip-wide power source or other voltage island power source. Voltage island power sources can be switched on and off in accordance with the operational demands of the integrated circuit requiring supply current from the chip-wide power source and consuming power only when required for functional operation of the IC.

However switching of the VI power supply places the IC at risk of failure due to step response voltage transients and their inherent oscillation frequencies. Each time an island is powered up, the initial current requirements needed to charge diffusions and wells within the island must come solely from on-chip quiet capacitors associated with the chip-wide power source, as the inductive properties of the package prevent real-time charge replacement. These sudden changes in current requirements generate a step response in the chip-package power bus network which results in damped ringing of the power bus voltage, i.e., power supply perturbation.

Figure 6:
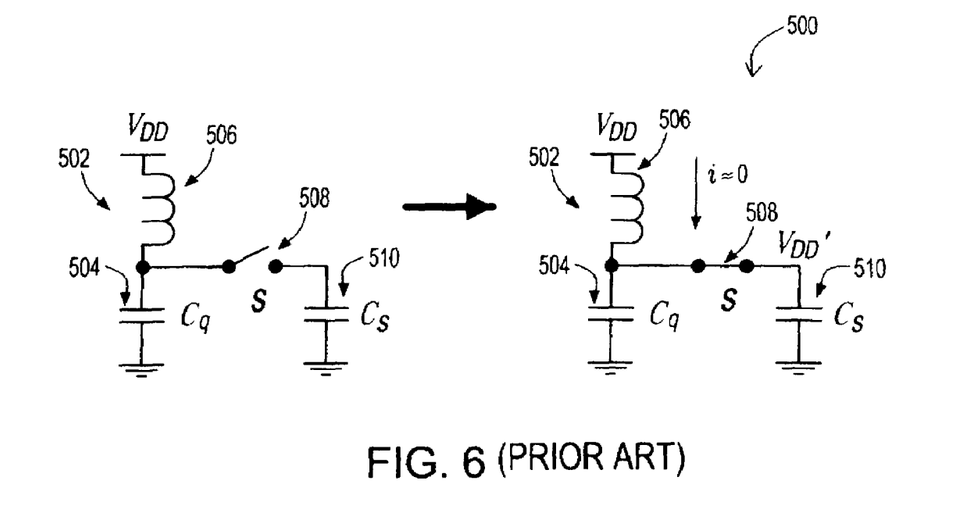
FIG. 6 is a schematic of a circuit according to the prior art.

Referring to FIG. 6, circuit diagrams 500 of the T0− and T0+ power supply response due to voltage island power-on is shown. Just before power on, the bus system is stable and the quiet capacitance 504 in the circuit 502 is fully charged. The rate of change in current flow through the inductor 506 to Cq is 0. At time 0, voltage island capacitance, Cs 510, is switched onto the bus using switch 508 and begins to charge to the rail value. Charging of Cs 510 presents an instantaneous current demand in the circuit 502, or high di/dt to the $V_{DD}$ bus, however, due to the inductive component 506 of the bus, the initial di/dt current remains 0 and all charge pulled into Cs (510) is pulled out of Cq (504) in a charge sharing event. The result is that the voltage across Cq (Vcq) falls. The ratio of the Vcq at T0+ relative to Vcq at T0− illustrated in FIG. 6, is represented by the equation $V_{DD}'/V_{DD}=Cq/(Cq+Cs)$ and is directly related to the capacitance of the voltage island relative to the IC remainder. Thus, an undesirable step response results which produces unwanted power supply perturbation.

The oscillation produced by the di/dt event excitement of the IC chip/package RLC network is typically in the 80 MHz to 200 MHz range in present day semiconductors. These frequencies are centered around clock frequencies typically encountered in ICs for both data processing and I/O functions which further compromises functionality of the IC as the voltage oscillation affects path delays within the IC from cycle to cycle. Past IC chip designs have been unable to adequately resolve the undesirable step response issue. With advances in IC technology and the drive to higher performance and lower power products, integrated circuits are being designed to lower rail voltages to power the chip. These challenges require even more attention to power distribution in the chip and the affects of step response perturbation at each new technology node.

Figure 4:
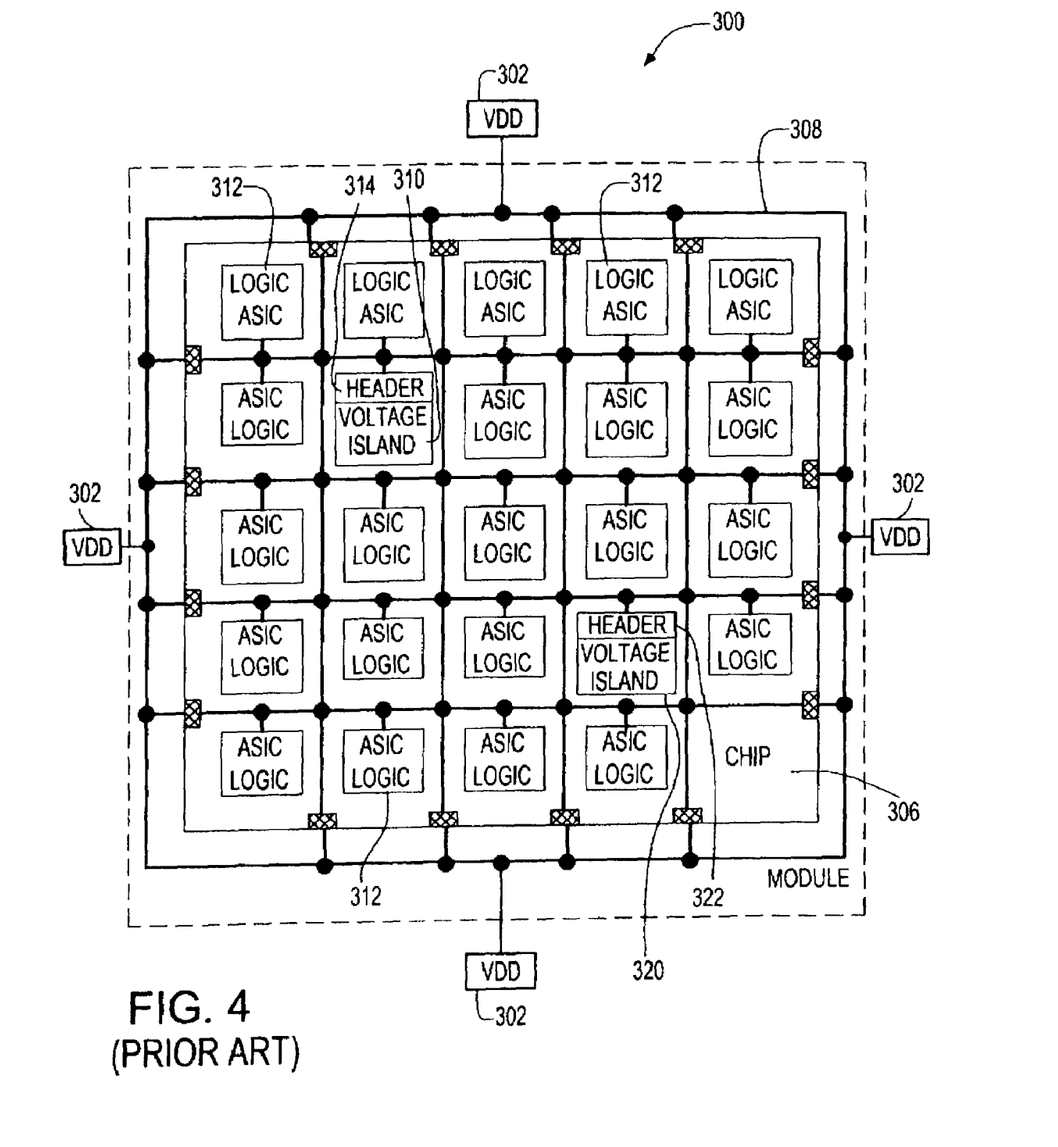
FIG. 4 is a block diagram of a prior art IC.

Referring to FIG. 4, a typical known semiconductor IC module 300 including two voltage islands 310, 320 is shown. A power supply $V_{DD}$ is brought from off-module/chip from a plurality of $V_{DD}$ inputs 302 which are shorted together at chip level to form a robust power network/bus 308. Logic circuits, are distributed throughout the IC/chip 306 and attached to the power network. The two voltage islands 310, 320 are also powered by the power network 308, however, power to these islands of logic function 310, 320 is gated using header circuits 314, 322, respectively, disposed between the global power supply network of the IC chip/module 308 and the local power supply network of the voltage islands 310, 320. Each voltage island implemented within the IC/chip 306 may be controlled independently with regard to its power up/down condition at any time during IC function.

Figure 5:
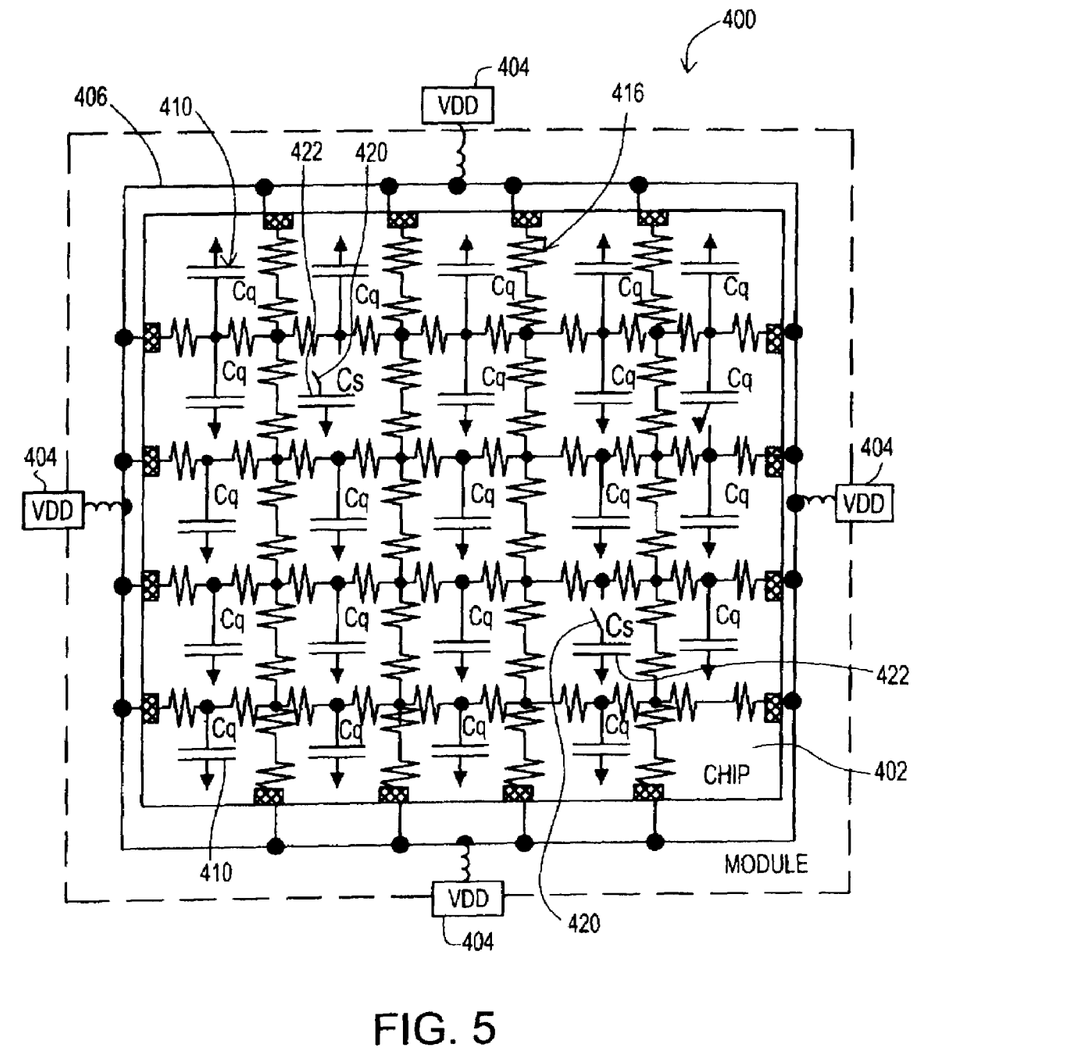
FIG. 5 is an electrical equivalent of the prior art IC shown in FIG. 4.

Referring to FIG. 5, the electrical equivalent of a typical IC RLC network 400 is shown. It is understood the logic functions connected to the power supply network consume some amount of functional current, and are modeled as capacitor components Cq 410 that comprise diffusions and wells within the circuits which provide storage capacity for charge associated with the power supply voltage $V_{DD}$ 404. As a result, circuits are modeled as the Cq component 410 of the power supply network. The summation of module, image and circuit contributions yields an RLC network 400 for the power bus. Similar to the logic outside voltage islands, logic inside a voltage island is modeled as a capacitance 422, however, as these supply capacitances are charged and discharged in response to a power supply switch (header) they are defined as switching capacitance (Cs) 422. The typical IC RLC network, as shown in FIG. 5, has disadvantages. For example, when power is brought in from off module/chip 402, and the voltage island switch 420 is engaged, unwanted inductance associated with the IC package and IC image is encountered. Additionally, while the power supply system within the IC is quite robust, there remains some amount of resistance associated with each segment of the bus 406 that affects both the transient and DC response of the power supply network.

Presently, noise reduction during voltage island turn on is managed through design of the header circuits which gate power to the voltage island. Headers are designed to provide a time-decreasing impedance between the power bus and island to slow charge up, and therefore reduce unwanted current step response (di/dt).

Figure 7:
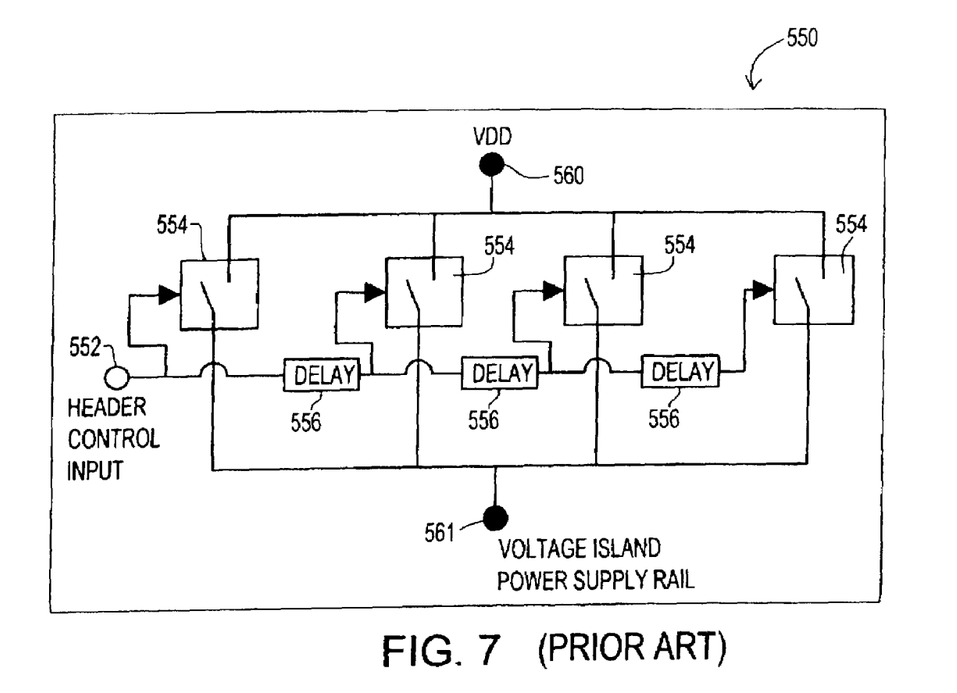
FIG. 7 is a block diagram of a prior art header.

A block diagram for a prior art header circuit 550 is shown in FIG. 7. The header circuit 550 includes voltage supply $V_{DD}$ 560 and header control input 552 which provides selective coupling of voltage supply $V_{DD}$ 560 to Voltage Island Power Supply Rail 561 through a plurality of power supply coupling switches 554. Built-in delay units 556 time separate activation/deactivation switches 554 in response to control input 552 to limit di/dt during the voltage island power-up/power-down. In addition to header control input 552, typical voltage islands also include at least a second control signal to control the logic boundary of the VI independent of the header control 552. Design of these structures is complex and may not always optimize turn-on time for the internal capacitance of the voltage island. Thus, typical header circuits have not been successful in mitigating RLC-induced power supply ringing caused by current step response during voltage island power-up/power-down. Thus, there is a need for a circuit structure and method for coupling a voltage island to a semiconductor power bus which more effectively eliminates the step response and unwanted power supply perturbation of conventional IC designs.

SUMMARY OF THE INVENTION

The invention relates to a design structure for reducing noise in an integrated circuit having one or more voltage islands. Provided is a first power supply directly coupled to logic circuits exclusive of voltage islands within the IC and a primary circuit comprising a first switch for selectively coupling first power supply to voltage island logic circuits. A pre-charge power supply provides an alternate power supply bus to the voltage island logic circuit and a secondary circuit comprised of a second switch selectively couples the pre-charge power supply to the voltage island logic circuit. The pre-charge power supply powers the voltage island logic circuit from an off state into a pre-charged state and the first power supply powers the voltage island logic circuit during operation.

In a related aspect of the invention, the pre-charge power supply connects to a plurality of secondary circuits.

In a related aspect of the invention, the pre-charge power supply connects to a plurality of secondary circuits on a plurality of integrated circuits.

In a further aspect of the invention, a device is provided for eliminating step response power supply perturbation during voltage island power-up/power-down on an integrated circuit. An IC chip including a primary power supply and a secondary power supply where the IC chip includes at least one voltage island. A primary header on the voltage island of the IC chip communicates with the primary power supply. A secondary header on the voltage island of the IC chip communicates with the secondary power supply. A control decoder communicates with the IC chip and the voltage island for regulating the state of the primary and secondary headers.

In a related aspect of the present invention, the primary header on the voltage island of the IC chip communicates with the primary power supply via a primary header power path on the IC chip. Also, the secondary header on the voltage island of the IC chip communicates with the secondary power supply via a secondary header power path on the IC chip.

In a related aspect of the present invention, the control decoder sequentially enables the secondary header on the voltage island while the primary header on the voltage island is disabled. The control decoder disables the secondary header on the voltage island and near simultaneously enables the primary header on the voltage island.

In a related aspect of the present invention, the secondary power supply connects to a plurality of secondary headers.

In a related aspect of the present invention, the secondary header power supply connects to a plurality of secondary headers on a plurality of IC chips.

In a related aspect of the present invention the device includes a header control system for managing at least one voltage island including the primary and secondary headers.

In a related aspect of the present invention, the header control system prioritizes initial power requests from multiple voltage islands.

In a related aspect of the present invention, the device includes a header control system for managing multiple voltage islands which include the primary and secondary headers. The voltage islands share the secondary power supply via the secondary header power path such that the header control system limits loading of the secondary power supply.

In a related aspect of the present invention the voltages on the primary header and the secondary header are substantially the same.

In a related aspect of the present invention the control decoder prevents disabling the secondary header on the voltage island and near simultaneously enabling the primary header on the voltage island during a period when noise is on the secondary header or the secondary voltage is not substantially equal to the primary voltage.

In a further aspect of the present invention, a method is provided for eliminating step response power supply perturbation during voltage island power-up/power-down on an integrated circuit. The method comprises the steps of providing an IC chip communicating with a primary power supply, and the IC chip including at least one voltage island. Providing a primary header on the voltage island of the chip, where the primary header communicates with the primary power supply via a primary header power path. Providing a secondary header on the voltage island of the chip where the secondary header communicates with a secondary power supply via a secondary header power path. Providing a control decoder communicating with the IC chip and the at least one voltage island. The method further comprises the steps of requesting an initial power-up of the voltage island, and enabling the secondary header using the control decoder. The secondary header is then disabled using the control decoder, and the primary header is enabled using the control decoder.

In a related aspect of the present invention, the secondary header is disabled and the primary header is enabled near simultaneously.

In a related aspect of the present invention, the method further comprises a power down sequence including a series of stepped reductions in current demand from the voltage island when the primary header is switched from enabled to disabled using the control decoder.

DETAILED DESCRIPTION OF THE INVENTION

The present invention provides a design structure of a new header design and image/package bus plan which eliminates the voltage island power-up issue of a step response during power up (di/dt) resulting in power supply perturbation. In addition, the present invention results in both efficient management of voltage island power state transition and efficient central management of voltage island power up. Further, the present invention teaches a topology for mitigation of island power-off (di/dt) transient mitigation.

The present invention provides a power on design structure for an IC voltage island having primary and secondary header circuits where the secondary header circuit is enabled and the island is pre-charged/repowered in a static mode. Then, the secondary header is disabled and the primary header is enabled to provide connectivity to a power bus with functional current-load capability. Finally, the island data/clock boundaries are enabled to start IC functional processing.

Figure 1:
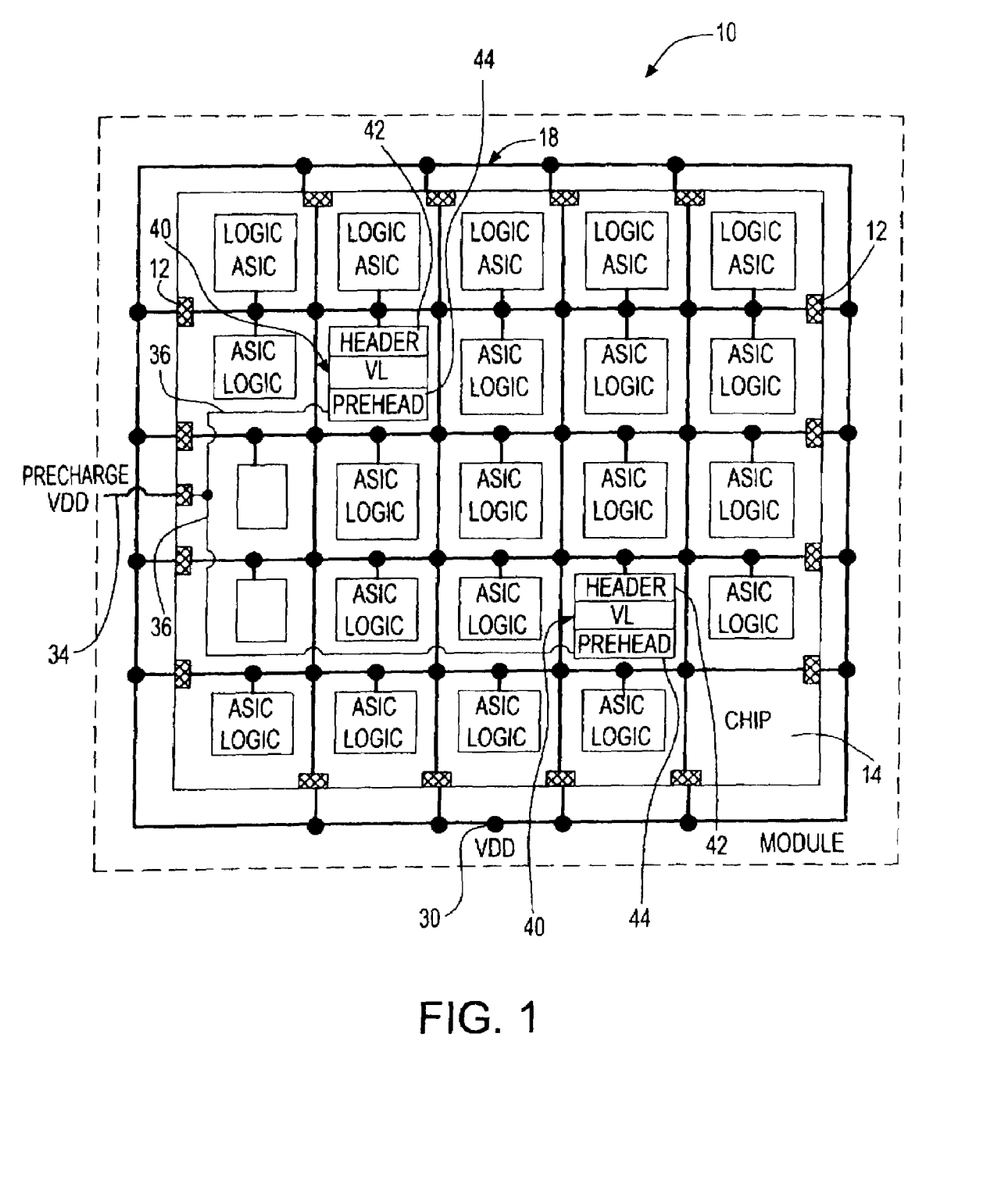
FIG. 1 is a block diagram of an Integrated Circuit (IC) according to the present invention depicting a header and a pre-header on a voltage island.

Referring to FIG. 1, an integrated circuit/module 10 designed in accordance with the present invention is shown. Integrated circuit/module 10 contains integrated circuit chip 14 connected to the module 10 using, for example, bond pads 12. In the present invention, each voltage island 40 within the chip 14 is provided with a header circuit or primary header 42 for selective connection to the primary or functional IC power supply network 30 via bus 18. Additionally, the voltage islands 40 include a pre-charge, or secondary header 44 for connection to a second, less substantial, secondary or pre-charge power supply network 34 which may connect to all voltage island secondary headers in the IC via a secondary or pre-charge header power path 36. The pre-charge power supply 34 is provided with its own off-module path (not shown) to provide isolation from the primary network.

Figure 2:
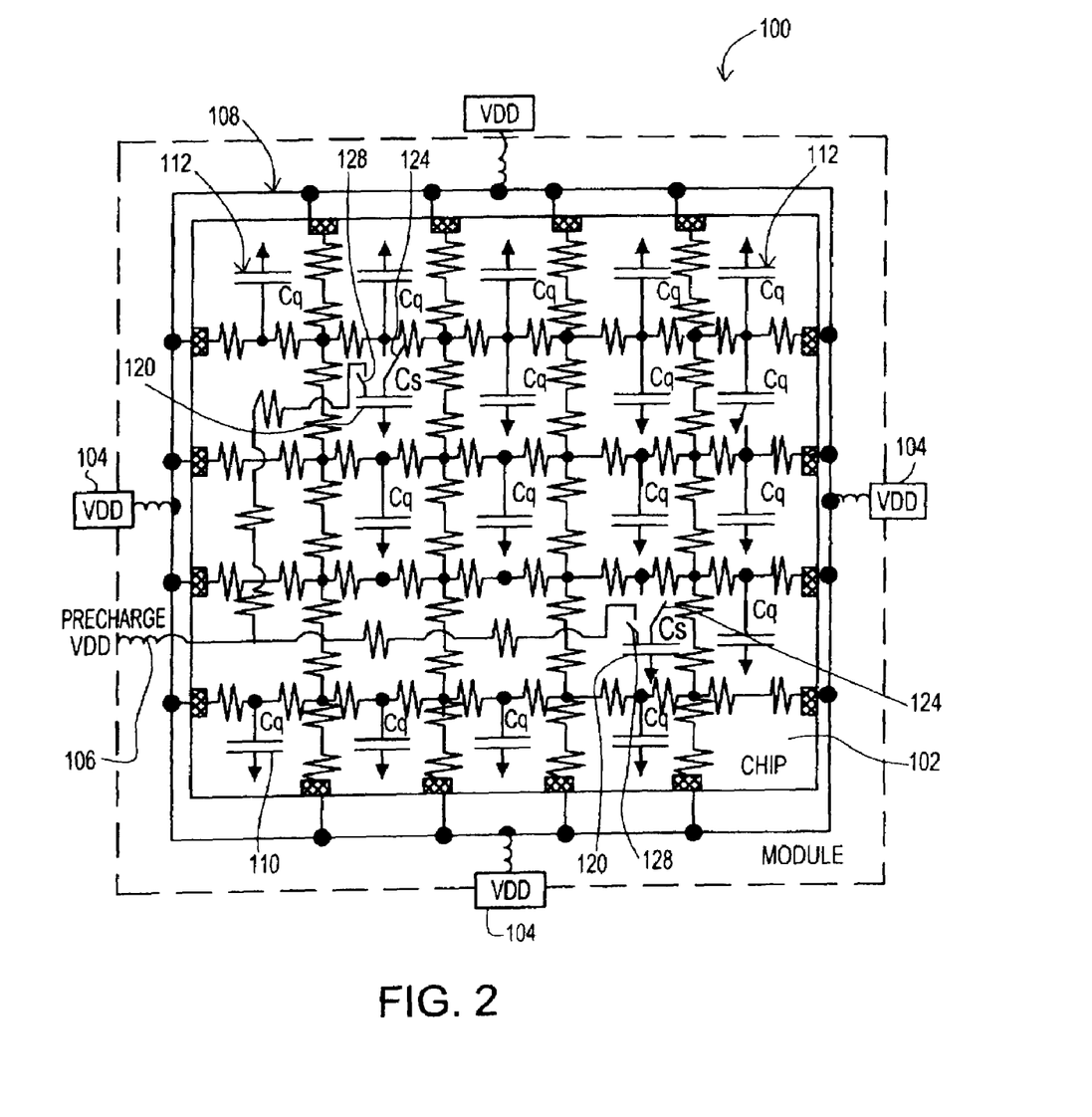
FIG. 2 is an electrical equivalent of the IC shown in FIG. 1.

Referring to FIG. 2, the electrical equivalent of FIG. 1 in accordance with the present invention is shown. The RLC network for integrated circuit/module 100 of FIG. 2 includes a secondary header switch 128 according to the invention to connect each voltage island 120 switching capacitance to the pre-charge power supply network/pre-charge $V_{DD}$ 106. As power is brought in from off module, inductance associated with the IC module package 100 and IC 102 power supply connections image is encountered. Additionally, while the power supply system within the IC 102 is quite robust, there remains some amount of resistance associated with each segment of the bus 108 that affects both the transient and DC response of the power supply network. The logic functions connected to the power supply network/bus 108 consume some amount of functional current, thus, they are modeled as capacitances/Cq component 112 due to diffusions and wells within the circuits which provide storage capacity for charge associated with the power supply $V_{DD}$ 104. The summation of module, image and circuit contributions yields an RLC network 100 for the power bus 108. Circuit logic inside a voltage island 120 is modeled as a capacitance in a manner common with logic functions 112, however, as these supply capacitances are charged and discharged in response to a power supply switches 124 and 128 of FIG. 2 which represent primary header 42 and secondary header 44 of FIG. 1, they are defined as switching capacitance (Cs).

The circuit logic outside and inside the voltage islands is fabricated using transistors and could have been depicted as such in FIGS. 2 and 3A-3C. However, charging and discharging of the voltage islands is in view in the present invention, and as such the circuit logic is depicted as capacitance for illustrative purposes as discussed above. Thus, the circuit logic within the ASIC, the header circuits, and the voltage islands is depicted in block diagram form in FIG. 1 and the circuit logic is illustrated using capacitance in FIG. 2 and FIGS. 3A-3C.

The secondary or pre-charge power supply network shown in FIG. 2 is comprised of inductive and resistive components representing module and chip components, however, it is not required that the primary and secondary bus networks be electrically equivalent.

In the present invention, the primary or functional power supply network 104 is sized to provide required load currents for functional operation of the IC 102 at low voltage droop (IR drop due to supply network resistance). The primary header circuit is for connecting the voltage island 120 to a primary power bus 108 in a functional mode, and thus, the header circuit and primary bus are capable of conducting a large amount of current with low IR drop. In addition, it is also advantageous for the IC interface between IC module 100 and IC chip 102 interface for the primary supply 104 to be made using multiple package-level connections which lowers the effective inductance of the primary supply network.

In contrast, the secondary supply network 106 does not have similar requirements. The secondary header 128 is intended to provide initial charging of the voltage island 120 Cs capacitance, therefore, current on the secondary supply 106 is limited to initial charging current (transient) and leakage (DC) current associated with the island. The secondary header and bus are sized for pre-charging the voltage island and to handle the leakage current of the island with a low IR drop. The secondary bus provides a separate path to chip/module level for the power supply.

As a result, the resistive component of the secondary power supply 106 including both the supply network and header on-resistance is only limited by the acceptable DC IR drop and associated voltage delta between the primary and secondary supplies 104, 106, caused by voltage island 120 DC leakage. Additionally, as the bus is intended to operate during power-up of the voltage island prior to functional use of the island, the inductance of the secondary network may be ignored with sufficient allowance for settling time between pre-charge initiation and functional switch-over. As a result, the secondary supply may be implemented with little additional power overhead.

Figure 3:
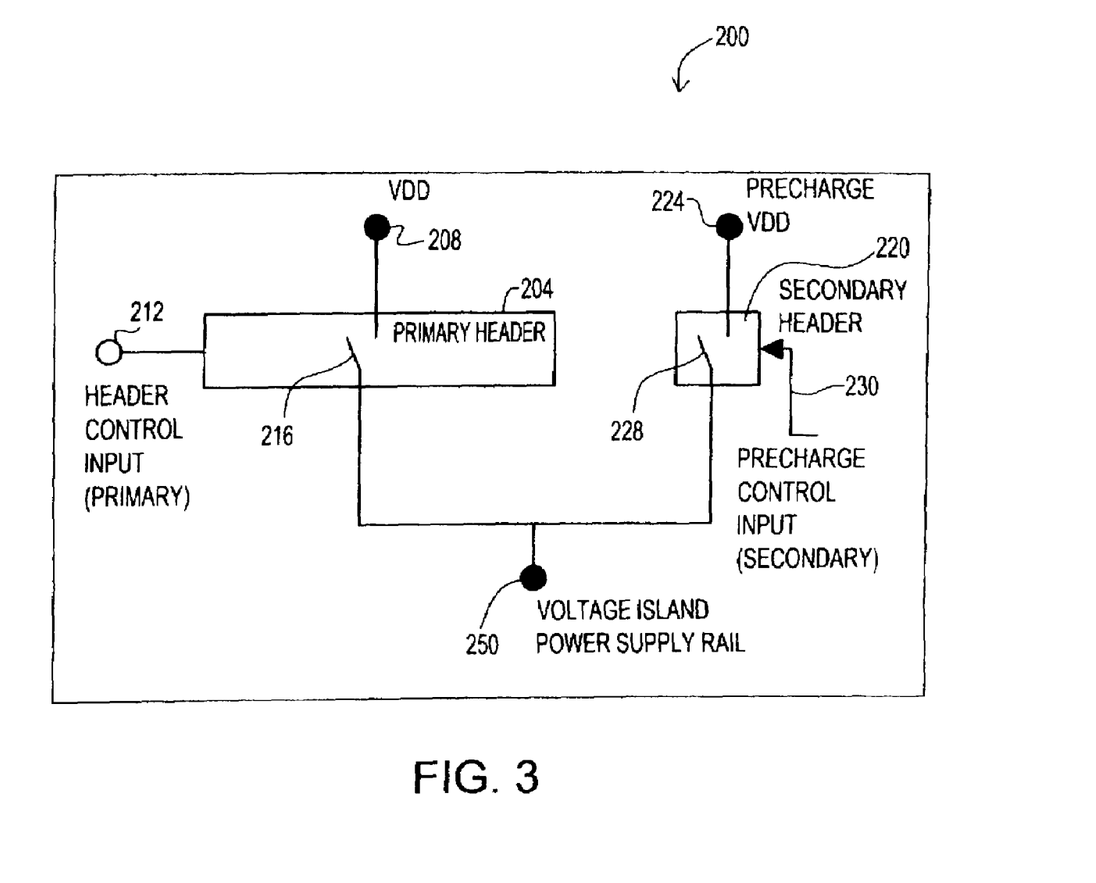
FIG. 3 is a block diagram of a voltage island header according to the present invention.

Referring to FIG. 3, the voltage island header 200 of the present invention includes both a primary 204 and secondary 220 header circuit. The primary header circuit 204 is sized to reduce the on-resistance of the connection, limiting functional mode IR drop between the primary supply network 208 and the voltage island supply network 250. The primary header circuit 204 of the present invention does not require staged turn-on to limit primary supply network 208 di/dt and associated noise which greatly simplifies the design of the circuit.

Referring to FIG. 3, control signals 212, 230 of the primary 204 and secondary 220 header circuits, respectively, are generated independently, but are not necessarily external to the header circuits. The secondary header circuit 220 may be much smaller than the primary header 204. The power supply network and header architecture of the present invention allows for the independent optimization of multiple design requirements.

Although FIGS. 1, 2 and 3 detail topologies associated with a power supply network, one skilled in the art would recognize that these same topologies are applicable to ground networks and that provisions for primary or secondary resources on the power supply, ground or both networks may be advantageous in separating power-on noise from the functional bus envelope.

Figure 3A:
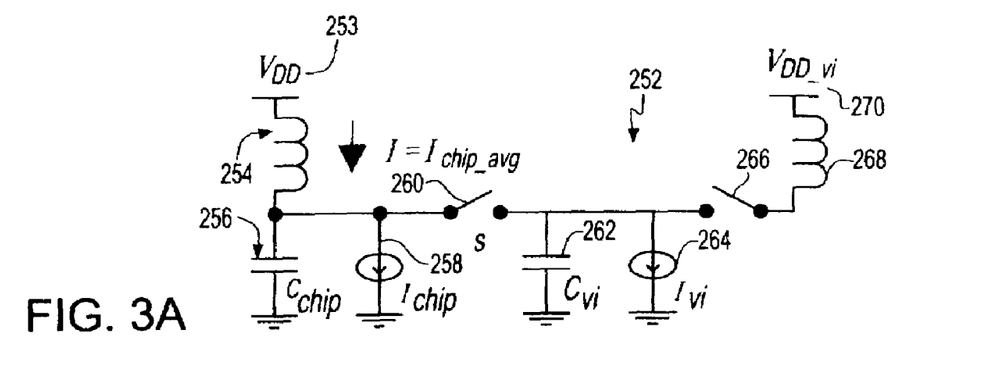
FIGS. 3A-3C are schematics of the circuit according to the present invention.
Figure 3B:
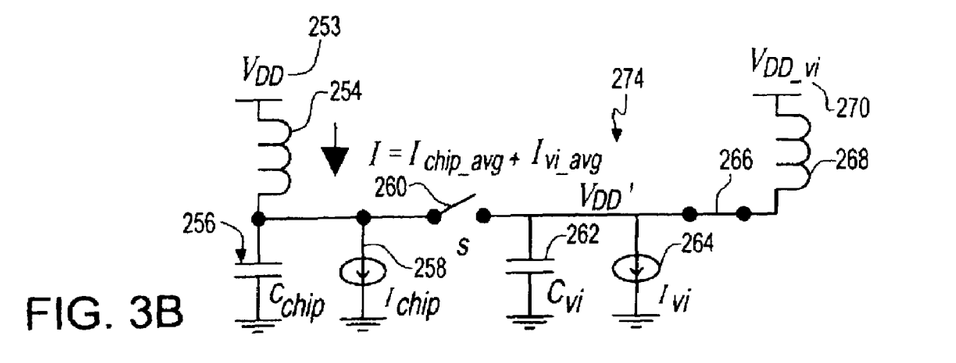
Figure 3C:
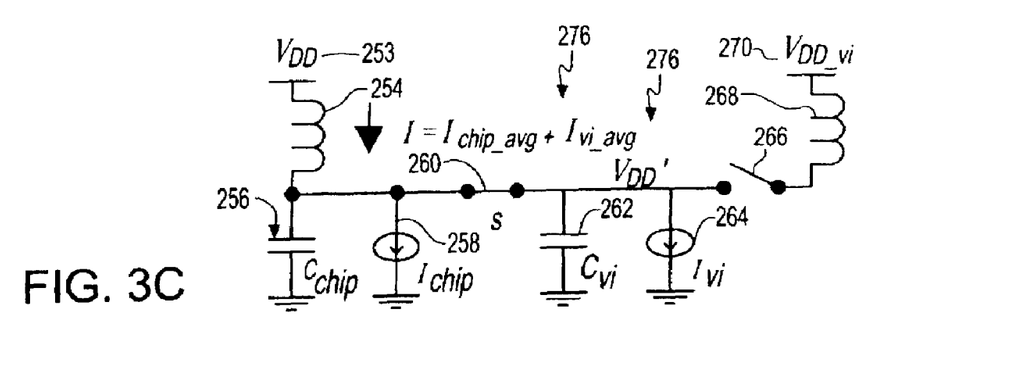

Referring to FIGS. 3A-3C equivalent circuit diagrams according to the present invention are shown depicting three states of the primary and secondary headers of the voltage island according to the present invention. Referring to FIG. 3A, the equivalent circuit model 252 includes the primary power supply 253 connected to an inductor 254 and a capacitor 256 (representing the chip capacitance), and current sink 258 (representing functional current consumption) of the IC exclusive of voltage islands. A switch 260 connects the primary power supply to a voltage island represented as a capacitor 262, and current sink 264. A secondary or pre-charge power supply 270 is connected through an inductor 268 and a switch 266 for connecting the pre-charge power supply 270 to the voltage island. The circuit 252 depicts the "00" state of the voltage island where both the primary power supply 253 and the pre-charge power supply 270 are disconnected from the voltage island by switches 260, 266, respectively.

Referring to FIG. 3B, the equivalent circuit model 274 depicts the "01" state of the voltage island where the pre-charge power supply 270 is connected by switch 266 to the voltage island, and the primary power supply 253 is not connected by switch 260. In this state, the large capacitance of the voltage island becomes charged through voltage island dedicated power supply 270 which may be shared across a plurality of voltage islands. Charging of capacitor 262 and leakage current 264, which increases with a rise in voltage across capacitor 262, does not affect or create di/dt or associated noise on primary power supply 253 and related chip capacitance 256.

Referring to FIG. 3C, the equivalent circuit model 276 depicts the "10" state of the voltage island where the pre-charge power supply 270 is disconnected from the voltage island using switch 266, and the primary power supply 253 is connected by switch 260. Voltage island capacitance 262 was previously pre-charged to substantially primary supply voltage 253 prior to connection of switch 260 and disconnect of switch 266, transient response on primary power supply bus 253 and associated chip logic capacitance 256 is avoided.

Figure 8:
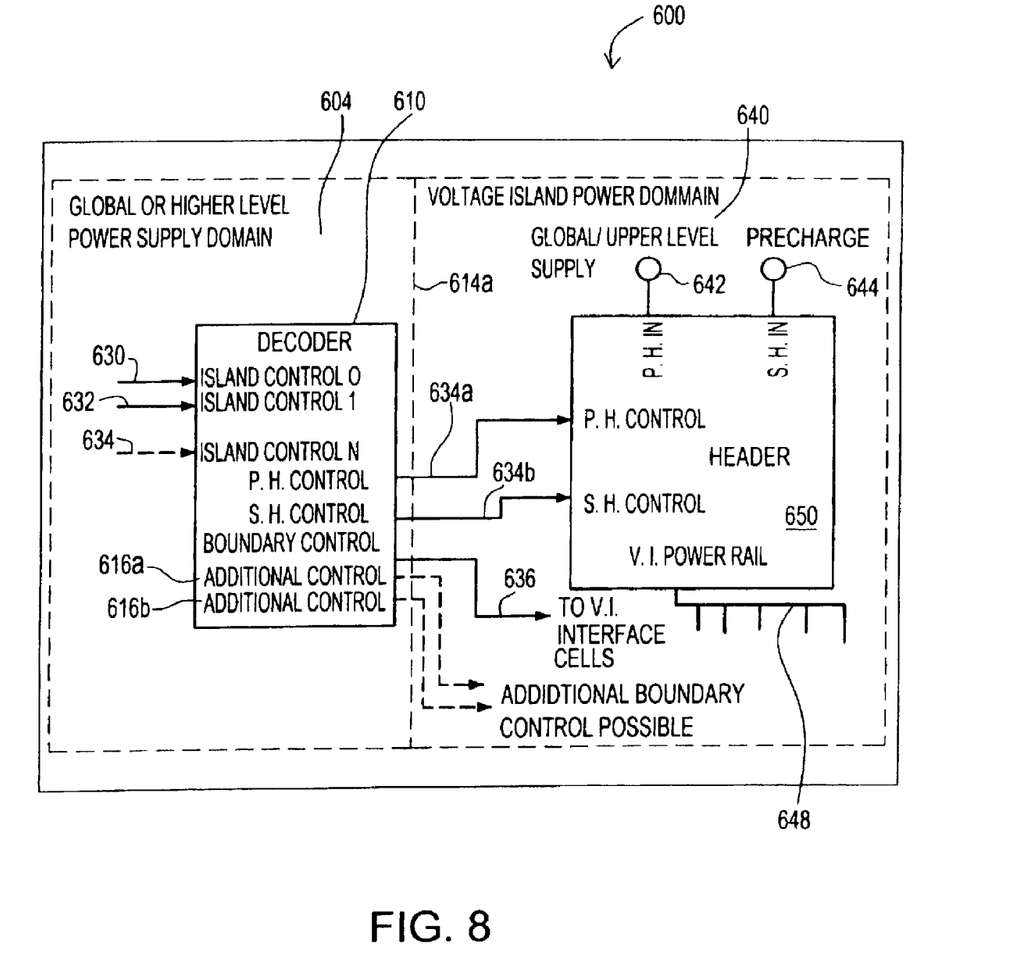
FIG. 8 is a block diagram of an embodiment of a control decoder.

Referring to FIG. 8, an exemplary control decoder 600 is shown which simplifies the generation and handling of the primary 204 and secondary 220 header control inputs (shown in FIG. 3). The present invention may be implemented with little or no additional control overhead compared to the typical control requirements of an IC. As a minimum requirement, two inputs with an associated decoder may be used to control the primary header, secondary header and logic boundary. It should be noted that the decode circuitry of the present invention is intended to remain functional during power up/down of an associated voltage island, therefore, decoder logic is associated with the un-gated primary power supply network of the IC.

Figure 11:
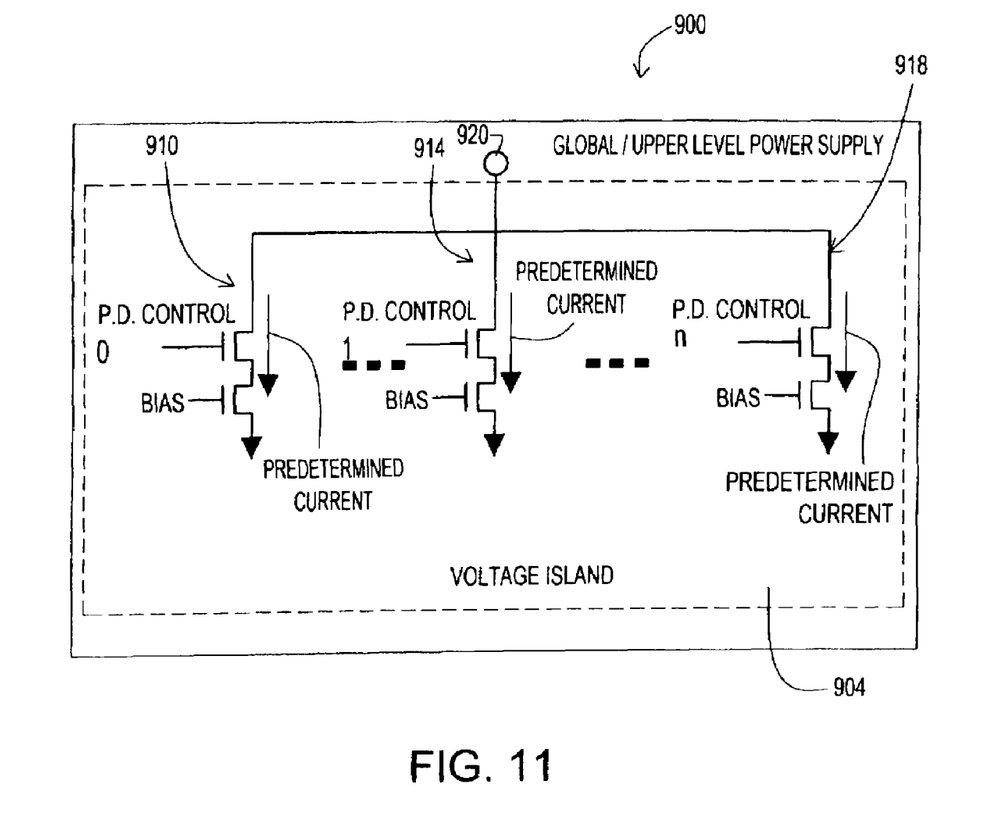
FIG. 11 is a circuit diagram depicting a power down embodiment of the present invention.

Referring to FIG. 8, a global power supply domain 604 and voltage island power domain 640 are depicted. The voltage island includes primary power supply connection 642 and secondary or pre-charge power supply connection 644. A decoder 610 communicates with the voltage island power domain 640. The decoder controls the different states of the voltage island, boundary 614a, and controls/generates further signals 616a and 616b for other devices. Particularly, the decoder 610 receives the voltage island state control signal inputs 630, 632 and 634 for programming the exemplary voltage island control states "01", "10", "11" and "10" via primary and secondary header control signal inputs 634a,b, respectively, for at least one voltage island in the chip. The decoder may also control voltage island interface cells which control propagation of data and/or clock signals across boundary 614a of voltage island power domain 600 via boundary control signal 636. As further illustrated in FIG. 8, the decode function may be easily expanded to add control to other boundary functions such as separate clock and data gating at power-up/down, or power-down di/dt current mitigation as shown in FIG. 11 using additional exemplary boundary control lines 616a and 616b. The voltage island power domain 640 includes the header 650, voltage island power rail 648 and connections for receiving the primary power supply 642 and the secondary (pre-charge) power supply 644.

Figure 9:
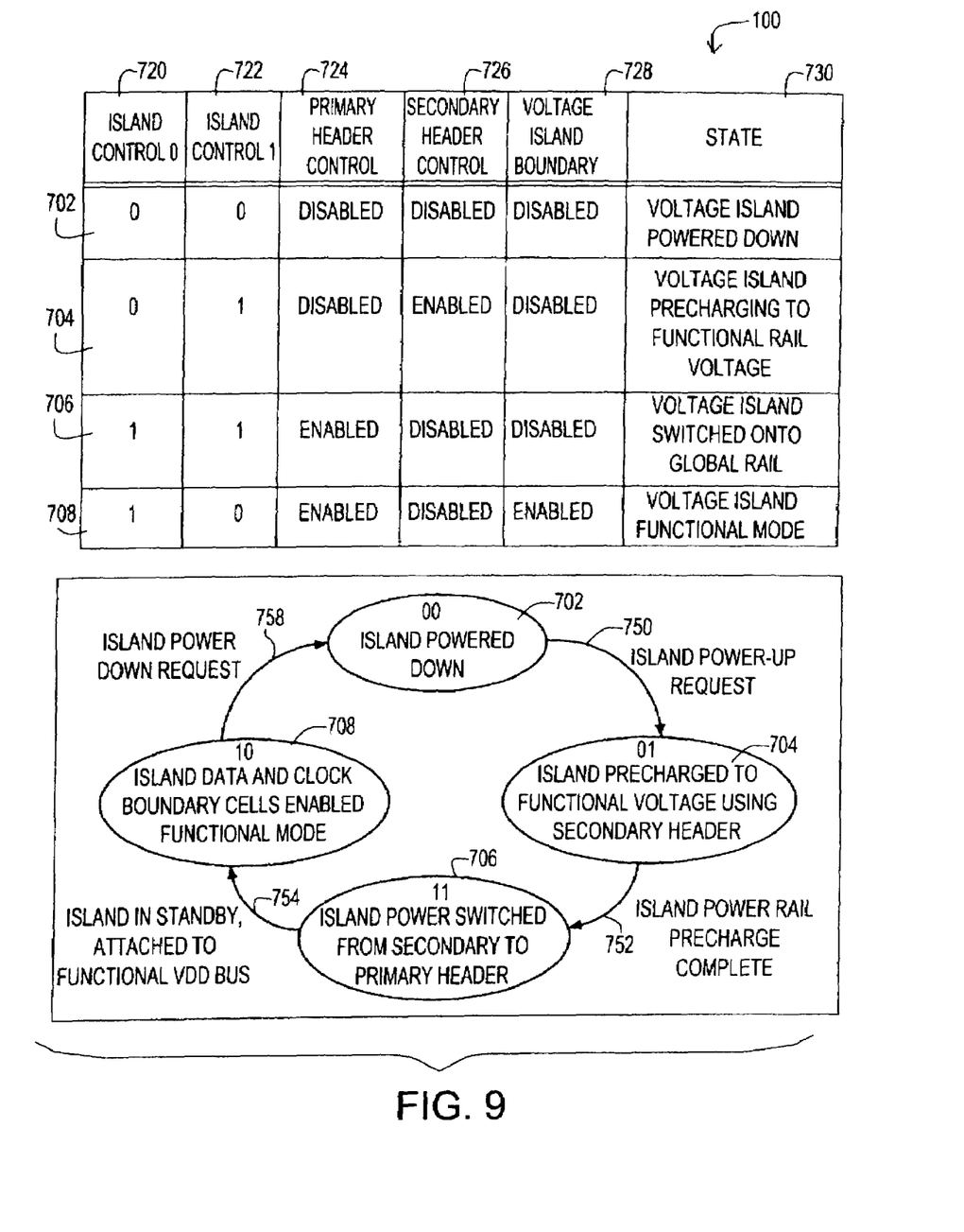
FIG. 9 is a table and state diagram of an embodiment of control flow according to the present invention.

Referring to FIG. 9 an exemplary control flow logic table 700 according to the present invention is shown that depicts the programming state 730 of the primary and secondary header control 724, 726, respectively, and voltage island boundary 728 in response to decoder outputs including the voltage island state control signal inputs to the decoder and include island control (0) 720, and island control (1) 722. The control flow begins by preparing the decoder with island control (0) 720 and island control (1) 722 set to logic "00" state 702. In this state, the voltage island is in full power-down mode 702 (e.g., after receipt of a power down request 758). Both the primary and secondary headers are disabled, as are the voltage island logic boundaries. In this state, valid outputs to logic outside the voltage island are maintained using voltage island interface cells, as are states within any state-keeping latches within the voltage island.

A Power up request is initiated 750 by programming the decoder with a "01" control logic state 704. The "01" control state 704 enables the secondary header. With the secondary header enabled, the voltage island is pre-charged to the voltage provided on the pre-charge power supply network minus any IR drop caused by voltage island current draw. The voltage value of the secondary or pre-charge power supply is substantially identical to the voltage value of the primary supply network. As clocks and logic inputs to the voltage island remain disabled in this mode, current is limited to any leakage within the voltage island. As the secondary supply includes an inductive component, some ringing may occur on the secondary bus, however as the voltage island remains in standby mode, sufficient time can be allowed prior to the next state transition to allow settling. Additionally, because the core is not connected to the primary supply network at this point, the step response is not impressed on the primary power supply network, or the functional circuits connected thereon. Timing between the "01" and "11" states may be gated by a counter or like delay function to allow settling time, an analog comparison function to insure level, a combination thereof, or more complex logic functions as will be described in greater detail in FIG. 10.

With state transition requirements satisfied, the system transitions 752 to program the decoder with logic "11" state 706. At this time, the voltage island is disconnected from the secondary supply (secondary header disabled) followed by enablement of the primary header. As the voltage island Cs has been pre-charged to at or near the primary bus voltage, little or no di/dt results from primary header enablement, thus, ringing on the functional power supply network is avoided and functional circuits remain unaffected.

With supply switching complete, the state is moved 754 to program the decoder with logic "10" 708 and the clock/data boundary is enabled. The voltage island enters functional mode at this point. In this example, as the result of a power-down request, the control state transitions from control logic "10" state 708 to logic "00" state 702 disabling the primary header and data/clock boundary, returning the voltage island to power down mode 702. One skilled in the art would recognize that the example state table, control flow and decoder shown in FIG. 9 could be extended to separate clock and data enablement during power-up, separate clock, data and header disablement during power down, or add other control ordering features.

Figure 10:
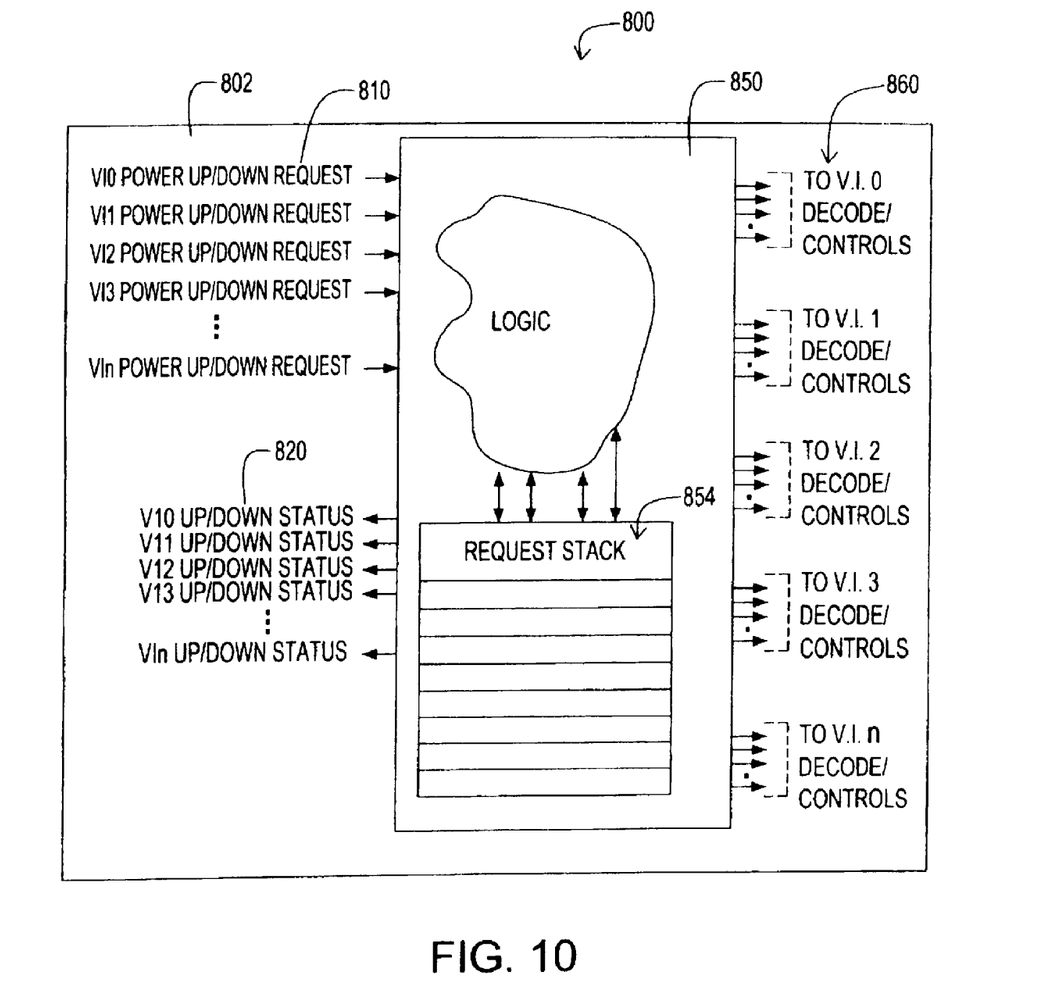
FIG. 10 is a block diagram of an embodiment of a control system.

Referring to FIG. 10, an exemplary higher-level control system for the voltage island and control decode topology of the present invention is shown. A request facility 802 includes voltage power up/down requests 810, which are forwarded to a central voltage island control facility 850 which may manage one or multiple voltage islands. The control facility 850 manages state changes in accordance with the power up/down request, the state diagram to be implemented, and any monitor inputs reporting voltage island voltages or other parameters, and implements the state changes 860. In addition, where multiple voltage islands share a single secondary or pre-charge power supply network, state transitions of the various islands may be managed to limit loading on the secondary supply in order to limit IR drop and insure that one island is not switched from the secondary to primary supply network at a time when noise may exist on the secondary network due to a recent charge-up event on another island. This limits the potential delta between the primary supply network and the voltage island pre-charge at the moment of state transition. The control facility 850 may also manage voltage island power-up prioritization if multiple requests appear simultaneously using a request stack 854. State reporting 820 and acknowledgement back to the island power-up/down request facilities 802 is included within the control facility 850.

It may also be desirable to reduce or eliminate any step response noise associated with voltage island power down. In most voltage islands, clocks are powered down and data boundaries stabilized prior to header disable. Shutdown of the clock network may produce enough change in current demand to initiate ringing in the power supply network. In these situations, the decoder and state diagram may be expanded to include additional power down sequencing.

Referring to FIG. 11, the circuit 900 having global/upper level power supply 920, may be added to the voltage island header of the present invention to affect power down di/dt reduction at the time of disablement of the clock and/or data in the system. The circuit 900 works in accordance with a state decoder to provide an initial leakage current shunt at the time of a disable request, which is followed by sequential reduction in leakage current 910, 914 until full power down 918 is reached. Thus, current demand associated with functional mode is stepped down slowly, even as the voltage island is disabled and stabilized. Sizing of the current sinks is made in accordance with the average functional current associated with island data/clock activity and a stepping plan. Bias for the switched current sources may come from a constant reference or a reference related to the primary power supply voltage (which relates to functional current). If a bias is not available, the current sink FETs may be connected in a diode configuration.

As an alternative to the embodiment of FIG. 11, if the majority of AC current draw comes from clock distribution and latches, the current step down function may be enabled using a system of segmented gating, in which each "power down control" line provides an enable/disable to a sub-portion of the clock tree within the island. Thus, at power-down, successive power-down of each gated region is ordered or staged to step down current requirements of the island gradually. As a prelude to gated/staged shutdown of the clock tree, any latched data to be saved to keeper-latches is saved and the data boundaries of the island are disabled to insure invalid data was not propagated outside the island. This same mechanism could be used to gradually increase the current draw of the island during power up, reducing the voltage island induced di/dt due to clock enablement. In this instance, gated portions of the tree would sequentially be enabled prior to enabling the voltage island logic boundary and returning data from keeper latches to functional latches.

Figure 12:
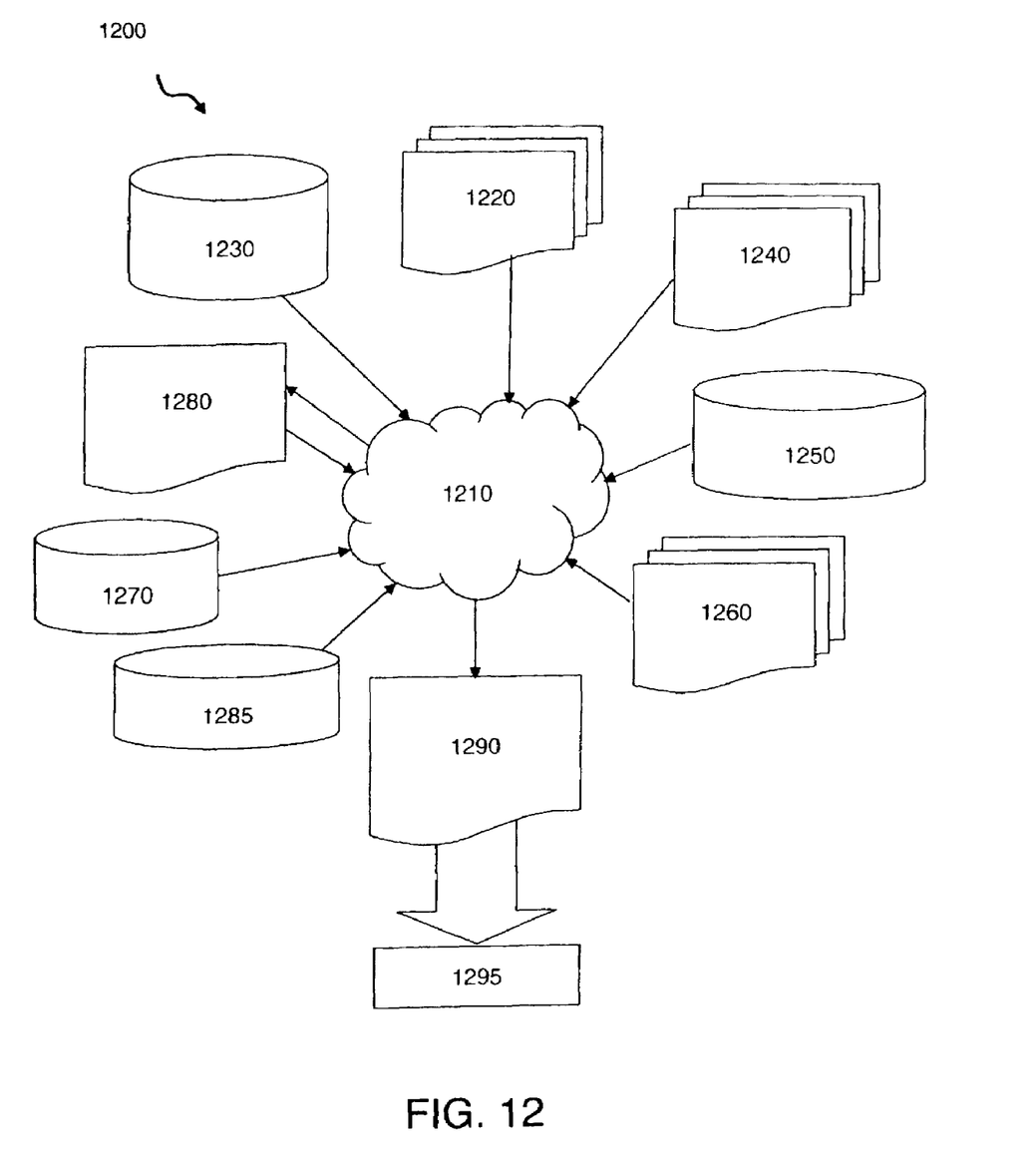
FIG. 12 is a flow diagram of a design process used in semiconductor design, manufacturing, and/or test.

FIG. 12 shows a block diagram of an example design flow 1200. Design flow 1200 may vary depending on the type of IC being designed. For example, a design flow 1200 for building an application specific IC (ASIC) may differ from a design flow 1200 for designing a standard component. Design structure 1220 is preferably an input to a design process 1210 and may come from an IP provider, a core developer, or other design company or may be generated by the operator of the design flow, or from other sources. Design structure 1220 comprises, for example, circuit 10, 100, 102, 252, 274, 276, etc., in the form of schematics or HDL, a hardware-description language (e.g., Verilog, VHDL, C, etc.). Design structure 1220 may be contained on one or more machine readable medium. For example, design structure 1220 may be a text file or a graphical representation of, for example, circuit 10, 100, 102, 252, 274, 276, etc. Design process 1210 preferably synthesizes (or translates), for example, circuit 10, 100, 102, 252, 274, 276, etc., into a netlist 1280, where netlist 1280 is, for example, a list of wires, transistors, logic gates, control circuits, I/O, models, etc. that describes the connections to other elements and circuits in an integrated circuit design and recorded on at least one of machine readable medium. This may be an iterative process in which netlist 1280 is resynthesized one or more times depending on design specifications and parameters for the circuit.

Design process 1210 may include using a variety of inputs; for example, inputs from library elements 1230 which may house a set of commonly used elements, circuits, and devices, including models, layouts, and symbolic representations, for a given manufacturing technology (e.g., different technology nodes, 32 nm, 45 nm, 90 nm, etc.), design specifications 1240, characterization data 1250, verification data 1260, design rules 1270, and test data files 1285 (which may include test patterns and other testing information). Design process 1210 may further include, for example, standard circuit design processes such as timing analysis, verification, design rule checking, place and route operations, etc. One of ordinary skill in the art of integrated circuit design can appreciate the extent of possible electronic design automation tools and applications used in design process 1210 without deviating from the scope and spirit of the invention. The design structure of the invention is not limited to any specific design flow.

Ultimately, design process 1210 preferably translates, for example, circuit 10, 100, 102, 252, 274, 276, etc., along with the rest of the integrated circuit design (if applicable), into a final design structure 1290 (e.g., information stored in a GDS storage medium). Final design structure 1290 may comprise information such as, for example, test data files, design content files, manufacturing data, layout parameters, wires, levels of metal, vias, shapes, test data, data for routing through the manufacturing line, and any other data required by a semiconductor manufacturer to produce, for example, circuit 10, 100, 102, 252, 274, 276, etc. Final design structure 1290 may then proceed to a stage 1295 where, for example, final design structure 1290: proceeds to tape-out, is released to manufacturing, is sent to another design house or is sent back to the customer.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A design structure embodied in a machine readable medium used in a design process, for reducing noise in an integrated circuit (IC) comprising:
 a primary circuit receiving a first power supply voltage for powering-up a voltage island circuit on the IC and functional circuitry on the IC;
 a secondary circuit receiving a second power supply voltage for powering-up the voltage island;
 a programmed device for directing the primary and secondary circuits for powering the voltage island circuit and functional circuitry, the programmed device directing the secondary circuit to initially enable powering-up of the voltage island circuit to a pre-charged state, and subsequently disabling the secondary circuit while directing the primary circuit to enable powering of the functional circuitry during operation and the voltage island circuit, wherein a step response is avoided at the voltage island; and,
 wherein said programmed device operates as a header control for prioritizing initial power requests for multiple voltage islands.

2. The design structure according to claim 1 wherein the primary circuit and the secondary circuit include primary and secondary switches, respectively.

3. The design structure according to claim 2, wherein the primary switch includes a primary transistor and the secondary switch includes a secondary transistor.

4. The design structure according to claim 1 wherein the primary circuit communicates with the first power supply via a first power path on the IC chip; and the secondary circuit communicates with the second power supply via a secondary power path on the IC chip.

5. The design structure according to claim 4 wherein the second power supply connects to a plurality of secondary circuits.

6. The design structure according to claim 4 wherein the second power supply connects to a plurality of secondary circuits on a plurality of integrated circuits.

7. The design structure according to claim 1 further including a voltage island control circuit for managing circuit logic on at least one voltage island.

8. The design structure of claim 1, wherein the design structure comprises a netlist, which describes the circuit.

9. The design structure of claim 1, wherein the design structure resides on a GDS storage medium.

10. The design structure of claim 1, wherein the design structure comprises test data files, characterization data, verification data, or design specifications.

11. A design structure for eliminating step response power supply perturbation during voltage island power-up/power-down on an integrated circuit, which comprises:
 an IC chip including a primary power supply and a secondary power supply, and the IC chip includes at least one voltage island; a primary header on the voltage island of the IC chip, the primary header communicating with the primary power supply; a secondary header on the voltage island of the IC chip, the secondary header communicating with the secondary power supply; and a control decoder communicating with the IC chip and the voltage island for regulating the state of the primary and secondary headers; and,
 a header control system for managing the primary and secondary header of the at least one voltage island,
 the header control system prioritizes initial power requests for multiple voltage islands.

12. The design structure of claim 11, wherein the primary header on the voltage island of the IC chip communicates with the primary power supply via a primary header power pat on the IC chip; and the secondary header on the voltage island of the IC chip communicates with the secondary power supply via a secondary header power path on the IC chip.

13. The design structure according to claim 12 further including a header control system for managing a plurality of voltage islands which each include the primary and secondary headers, and the plurality of voltage islands sharing the secondary power supply via the secondary header power path such that the header control system limits loading of the secondary power supply.

14. The design structure according to claim 12 wherein the voltages on the primary header and the secondary header are substantially the same.

15. The design structure of claim 11 wherein the control decoder sequentially enables the secondary header on the voltage island while the primary header on the voltage island is disabled, and the control decoder disables the secondary header on the voltage island and near simultaneously enables the primary header on the voltage island.

16. The design structure according to claim 15 wherein the control decoder prevents disabling the secondary header on the voltage island and near simultaneously enabling the primary header on the voltage island during a period when noise is on the secondary header or the secondary voltage is not sub substantially equal to the primary voltage.

17. The design structure according to claim 11 wherein the secondary header power supply connects to a plurality of secondary headers.

18. The design structure according to claim 11 wherein the secondary header power supply connects to a plurality of secondary headers on a plurality of IC chips.

* * * * *